(12) United States Patent
Li et al.

(10) Patent No.: US 12,248,334 B2
(45) Date of Patent: Mar. 11, 2025

(54) CLOCK CIRCUITS, COMPUTING CHIPS, HASH BOARDS AND DATA PROCESSING DEVICES

(71) Applicant: SHENZHEN MICROBT ELECTRONICS TECHNOLOGY CO., LTD., Guangdong (CN)

(72) Inventors: Nan Li, Guangdong (CN); Zuoxing Yang, Guangdong (CN); Zhijun Fan, Guangdong (CN); Haifeng Guo, Guangdong (CN); Chao Xu, Guangdong (CN)

(73) Assignee: SHENZHEN MICROBT ELECTRONICS TECHNOLOGY CO., LTD., Shenzhen (CN)

( * ) Notice: Subject to any disclaimer, the term of this patent is extended or adjusted under 35 U.S.C. 154(b) by 97 days.

(21) Appl. No.: 18/008,029

(22) PCT Filed: Mar. 30, 2021

(86) PCT No.: PCT/CN2021/083722
§ 371 (c)(1),
(2) Date: Dec. 2, 2022

(87) PCT Pub. No.: WO2021/244113
PCT Pub. Date: Dec. 9, 2021

(65) Prior Publication Data
US 2023/0236622 A1   Jul. 27, 2023

(30) Foreign Application Priority Data

Jun. 4, 2020   (CN) .......................... 202010501270.6

(51) Int. Cl.
*G06F 1/08*   (2006.01)
*G06F 1/04*   (2006.01)
(Continued)

(52) U.S. Cl.
CPC .................. *G06F 1/08* (2013.01); *G06F 1/10* (2013.01); *G06F 1/04* (2013.01); *G06F 9/3869* (2013.01); *H03K 3/037* (2013.01)

(58) Field of Classification Search
CPC ..... G06F 1/10; G06F 1/08; G06F 1/04; G06F 9/3869; H03K 3/037
(Continued)

(56) References Cited

U.S. PATENT DOCUMENTS

| | | | |
|---|---|---|---|
| 4,891,609 A | * | 1/1990 | Eilley .................... H03K 3/011 331/135 |
| 5,045,811 A | | 9/1991 | Lewis |

(Continued)

FOREIGN PATENT DOCUMENTS

| | | |
|---|---|---|
| CN | 105763193 A | 7/2016 |
| CN | 107357347 A | 11/2017 |

(Continued)

OTHER PUBLICATIONS

International Search Report and Written Opinion mailed Jul. 14, 2021 in International Patent Application No. PCT/CN2021/083722.
(Continued)

*Primary Examiner* — Ji H Bae
(74) *Attorney, Agent, or Firm* — Dickinson Wright PLLC

(57) ABSTRACT

The present disclosure relates to clock circuits, computing chips, hash boards and data processing devices. A clock circuit comprises M stages of clock drive circuits that are connected in series, M being an integer that is no less than 2, wherein N inverters connected in series are arranged between an input port and an output port of each stage of the M stages of clock drive circuits, N being an odd number that is no less than 3. The clock circuit may provide clock signals with excellent performance.

18 Claims, 7 Drawing Sheets

(51) Int. Cl.
*G06F 1/10* (2006.01)
*G06F 9/38* (2018.01)
*H03K 3/037* (2006.01)

(58) Field of Classification Search
USPC .............................. 713/401, 500, 503, 600
See application file for complete search history.

(56) References Cited

U.S. PATENT DOCUMENTS

| | | | |
|---|---|---|---|
| 5,130,566 A * | 7/1992 | Nguyen | H03K 5/151 327/295 |
| 5,420,806 A | 5/1995 | Shou et al. | |
| 5,604,458 A | 2/1997 | Shou et al. | |
| 5,668,484 A | 9/1997 | Momura | |
| 5,811,859 A | 9/1998 | Shou et al. | |
| 5,917,343 A | 6/1999 | Shou et al. | |
| 6,737,926 B2 | 5/2004 | Forbes | |
| 7,627,003 B1 * | 12/2009 | Fouts | H03L 7/085 327/158 |
| 8,392,744 B2 | 3/2013 | Lin | |
| 8,593,197 B1 | 11/2013 | Cheng | |
| 2002/0101947 A1 * | 8/2002 | Sumiyoshi | H03L 7/0816 713/400 |
| 2004/0189359 A1 * | 9/2004 | Shah | H03L 7/085 327/158 |
| 2012/0019295 A1 | 1/2012 | Lin | |
| 2012/0105123 A1 | 5/2012 | Brown et al. | |
| 2014/0078795 A1 | 3/2014 | Li et al. | |
| 2014/0218084 A1 | 8/2014 | Verbeure | |
| 2018/0183577 A1 * | 6/2018 | Suresh | H04L 9/0643 |
| 2024/0036113 A1 * | 2/2024 | Chen | G01R 31/317 |
| 2024/0077906 A1 * | 3/2024 | Li | G06F 1/08 |

FOREIGN PATENT DOCUMENTS

| | | |
|---|---|---|
| CN | 208861273 U | 5/2019 |
| CN | 111510137 A | 8/2020 |
| CN | 111562808 A | 8/2020 |
| CN | 212086173 U | 12/2020 |
| EP | 0924859 B1 | 2/2004 |
| TW | 201411621 A | 3/2014 |
| TW | 201448470 A | 12/2014 |
| WO | 2012129284 | 9/2012 |

OTHER PUBLICATIONS

Bizon et al., "Multi-Stage Inverter Topologies for an Energy Generation Systems", 13th International Symposium on Modeling, Simulation and System's Identification (SIMSIS 2007), Sep. 22, 2007, Galati, Romania.

Yao, "Integrated Inverter and Data Buffer", Electronic Circuit Design and Practice, Oct. 31, 2001, Shandong Science and Technolgy Press, China.

Zhu, "Research and Design of Low Voltage and Power CMOS Oscillator", Electronic Technology & Information Science, China Master's Theses Full-text Database, No. 02, Feb. 15, 2020.

Jovanovic et al., "Pulsewidth Control Loop as a Duty Cycle Corrector", Serbian Journal of Electrical Engineering, Jun. 2004, pp. 215-226, vol. 1, No. 2.

First Office Action issued in Taiwanese Patent Application No. 110111458.

Second Office Action issued in Taiwanese Patent Application No. 110111458.

Ma, Cong, et al., A Tunable Multi-Phase Clock Generator for Pipelined A/D Converter, Microelectronics, Oct. 2010, pp. 641-643, 648, vol. 40, No. 5 (with English Abstract).

Zhang Ming-wen, Design of Low-jitter Clock Duty Cycle Stabilizer in High-performance Pipelined ADC, Journal of Huaihua University, May 2018, pp. 66-71, vol. 37, No. 5 (with English Abstract).

Demartinos, Andreas-Christos, et al., Analogue feedback inverter based duty-cycle correction, Analog Integrated Circuits and Signal Processing, Dec. 31, 2017, full text.

* cited by examiner

CLOCK CIRCUITS, COMPUTING CHIPS, HASH BOARDS AND DATA PROCESSING DEVICES

CROSS REFERENCE TO RELATED APPLICATIONS

The present application is a U.S. national stage entry of International Application No. PCT/CN2021/083722, filed Mar. 30, 2021, which claims priority to Chinese Patent Application No. 202010501270.6, filed Jun. 4, 2020, the contents of which are hereby incorporated by reference in their entireties.

TECHNICAL FIELD

The present disclosure relates to a field of electronic circuits, in particular to clock circuits, computing chips, hash boards and data processing devices to which the clock circuits are applied.

BACKGROUND

Many computing chips include pipeline structure(s). A pipeline structure may include multiple stages of pipeline circuits that are cascaded (or, connected in series) for executing data processing task(s). Usually, each stage of the multiple stages of pipeline circuits requires a clock signal. These required clock signals may be provided by a clock circuit. The clock circuit may include multiple stages of clock drive circuits. An initial clock signal provided by a clock source may be transmitted along these clock drive circuits stage by stage and output to each stage of the pipeline circuits.

SUMMARY

Embodiments of the present disclosure aim to provide and apply clock signals with improved performance.

According to a first aspect of the present disclosure, a clock circuit is provided, comprising M stages of clock drive circuits that are connected in series, M being an integer not less than 2, wherein N inverters connected in series are arranged between an input port and an output port of each stage of the M stages of clock drive circuits, N being an odd number not less than 3.

According to said aspect of the present disclosure, the output port of each stage of the M stages of clock drive circuits provides a clock signal for a corresponding stage of pipeline circuit in a pipeline structure for executing a data processing task.

According to said aspect of the present disclosure, a corresponding load balancing and phase adjusting module is provided between the output port of each stage of the M stages of clock drive circuits and an clock signal input port of the corresponding stage of pipeline circuit in the pipeline structure, and the load balancing and phase adjusting module contributes to a part of an output capacitance load for said stage of clock drive circuit and adjusts a phase of the clock signal output by said stage of clock drive circuit.

According to said aspect of the present disclosure, the load balancing and phase adjusting module comprises an inverter and a buffer, and the load balancing and phase adjusting module is configured according to one of the following two configuration modes: a first configuration mode, in which an input port of the inverter and an input port of the buffer are both connected to an output port of a corresponding stage of clock drive circuit, an output port of the inverter is connected to an clock signal input port of the corresponding stage of pipeline circuit in the pipeline structure, and an output port of the buffer is unloaded; or a second configuration mode, in which the input port of the inverter and the input port of the buffer are both connected to the output port of the corresponding stage of clock drive circuit, the output port of the buffer is connected to the clock signal input port of the pipeline circuit in the pipeline structure, and the output port of the inverter is unloaded.

According to said aspect of the present disclosure, two load balancing and phase adjusting modules corresponding to two adjacent stages of the M stages of clock drive circuits have configuration modes that are selected from the first configuration mode and the second configuration mode but are different from each other.

According to said aspect of the present disclosure, each load balancing and phase adjusting module corresponding to each stage of the M stages of clock drive circuits has a same input capacitance.

According to said aspect of the present disclosure, the inverter in all load balancing and phase adjusting modules has a same input capacitance, and the buffer in all load balancing and phase adjusting modules has a same input capacitance.

According to said aspect of the present disclosure, the $k^{th}$ inverter in the N inverters of each stage of the M stages of clock drive circuits has a same input capacitance, $1 \leq K \leq N$.

According to said aspect of the present disclosure, the N inverters in each stage of the M stages of clock drive circuits are of a same type.

According to said aspect of the present disclosure, an output port of the $M^{th}$ stage of clock drive circuits is connected to an additional load element, the additional load element having a same input capacitance as the first inverter in the N inverters of each stage of the clock drive circuits.

According to said aspect of the present disclosure, the input port of the first stage of the M stages of clock drive circuits is connected to an external clock source to receive an initial clock signal.

According to said aspect of the present disclosure, the initial clock signal is a square wave signal with a duty cycle of 50%.

According to said aspect of the present disclosure, the data processing task comprises executing a SHA-256 algorithm.

According to said aspect of the present disclosure, the pipeline circuit comprises at least one of a storage circuit and an operation circuit, for executing the SHA-256 algorithm.

According to a second aspect of the present disclosure, a computing chip is provided, comprising a clock circuit described in any aspect above.

According to a third aspect of the present disclosure, a hash board is provided, comprising a computing chip described in the aspect above.

According to a fourth aspect of the present disclosure, a data processing device is provided, comprising a hash board described in the aspect above.

According to various aspects of the present disclosure, clock signals with improved performance may be provided with a simple circuit structure at a low cost. The exemplary embodiments of the present disclosure are described in detail with reference to the drawings, so that other features and advantages of the present disclosure become apparent.

BRIEF DESCRIPTION OF DRAWINGS

The drawings constituting a part of this specification describe embodiments of the present disclosure, and are used together with the description to explain the principles of the present disclosure.

With reference to the drawings and in accordance with the detailed description below, the present disclosure may be understood clearly, in which.

Figure 1:
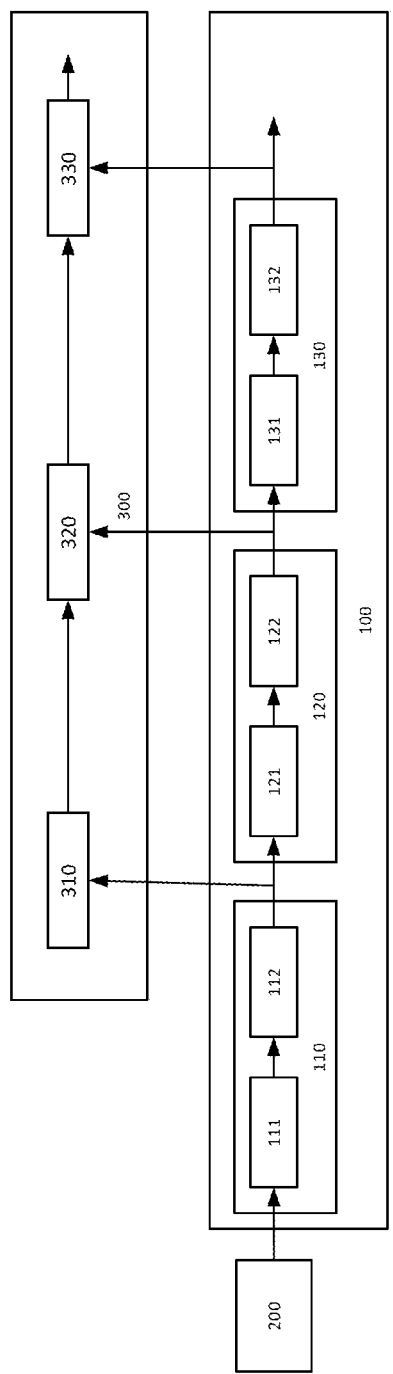
FIG. 1 illustrates a schematic diagram of a clock circuit.

Note that, in the implementations described below, a same reference numeral may be used across different drawings to illustrate a same part or to illustrate parts with a same function, with the repeated description omitted. In this specification, similar numerals and letters represent similar items; therefore, once an item is defined in a drawing, it may not need to be further discussed in subsequent drawings.

For easy understanding, the positions, sizes, scopes and the like of each structure shown in the drawings may not represent its actual positions, sizes, scopes and the like. Therefore, the disclosed contents are not limited to the disclosed positions, sizes, scopes and the like of the drawings. In addition, the drawings may not necessarily be drawn to scale, and some features may be enlarged to show details of a specific component.

DETAILED DESCRIPTION

Various exemplary embodiments of the disclosure will be described in detail below with reference to the drawings. Note that, unless otherwise specified, relative arrangements of components and steps, numeric expressions and values described in these embodiments are not intended to limit the scope of the disclosure.

The description of at least one exemplary embodiment below is only illustrative, but not intended to be any limitation to this disclosure or application or use thereof. That is, circuits and methods used for implementing hash algorithms herein are shown in an exemplary manner to illustrate different embodiments of the circuits or the methods of the present disclosure, rather than limitation. Those skilled in the art will appreciate that they only illustrate exemplary ways, rather than exhaustive ways, to implement the disclosure.

The technology, methods and devices known by those of ordinary skill in the related art may not be discussed in detail. However, the technology, methods and devices shall be regarded as a part of the specification as needed.

With functions of computing chips becoming complex, the number of stages of pipeline circuits is also significantly increased. For example, a computing chip used for executing a data processing task related to virtual digital cryptocurrency (such as Bitcoin) may have pipeline circuits with dozens or hundreds of stages. In this case, it may be desired that the clock signals provided to various stages of pipeline circuits by the clock circuit maintain a certain signal amplitude and a certain duty cycle. Meanwhile, it may also be desired that such a clock circuit has a simple structure and a low cost.

FIG. 1 illustrates a schematic diagram of a clock circuit 100. The clock circuit 100 is coupled with a clock source 200 and a pipeline structure 300. The clock circuit 100 is configured to receive an initial clock signal from the clock source 200, and to provide clock signals to each stage of pipeline circuits 310, 320, 330 of the pipeline structure 300.

As shown in FIG. 1, the clock circuit 100 may include multiple stages of clock drive circuits 110, 120, 130 that are connected in series. The initial clock signal, which is provided by the clock source 200, may be provided to a first stage of clock drive circuit 110. An output clock signal from the first stage of clock drive circuit 110 may be provided to a second stage of the clock drive circuit 120. An output clock signal from the second stage of clock drive circuit 120 may be provided to a third stage of the clock drive circuit 130. The next stage of the clock drive circuit generates a new clock signal based on the clock signal received from the previous stage of the clock drive circuit. The output clock signal from each stage of clock drive circuits 110, 120, 130 is also provided, as the clock signal, to a corresponding stage of pipeline circuits 310, 320, 330 in the pipeline structure 300.

In the clock circuit 100, each stage of clock drive circuit is configured to include an even number of inverters. Such configuration aims to provide clock signals having a same phase to each stage of pipeline circuits 310, 320, 330 in the pipeline structure 300. In the example of FIG. 1, each of the clock drive circuits 110, 120, 130 includes two inverters. These inverters are shown as 111, 112, 121, 122, 131, and 132. Those skilled in the art would know that an output signal of an inverter would have an opposite phase relative to an input signal of that inverter. That is, in response to an input signal being at a high-level, the output signal of the inverter will be at a low-level; and, in response to the input signal being at the low-level, the output signal of the inverter will be at the high-level. As such, when the clock drive circuit includes an even number of inverters connected in series, the output clock signal obtained through the even number of reversions of the input clock signal is in-phase relative to this input clock signal. The clock circuit 100 is formed by serially connecting a plurality of such clock drive circuits, so each output clock signal from each stage of clock drive circuit of the clock circuit 100 will be in-phase with each other.

The applicant of the present disclosure realizes that, although various stages of clock drive circuit of the clock circuit 100 may be able to provide output clock signals having the same phase as each other, a duty cycle of these output clock signals will gradually deviate from a duty cycle of the initial clock signal as the stages of the clock drive circuits increase. This will be discussed below with reference to FIG. 2.

Figure 2:
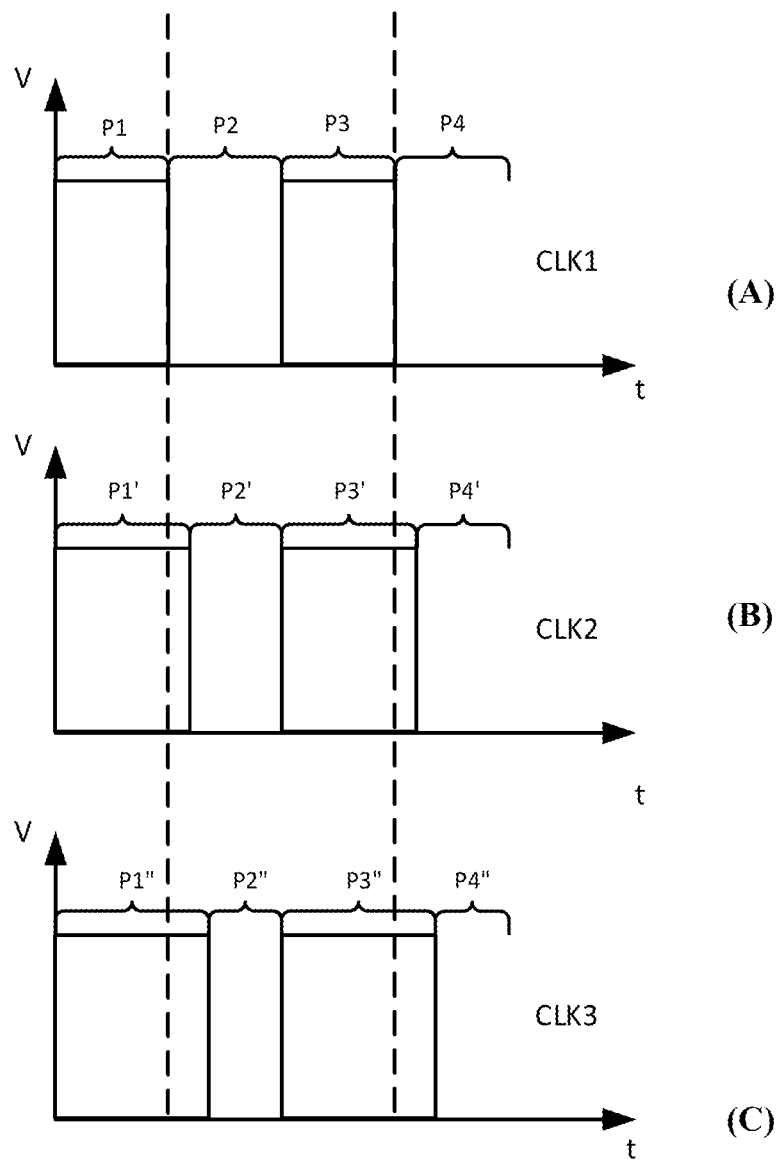
FIG. 2 illustrates an exemplary oscillogram of clock signals associated with the clock circuit of FIG. 1.

FIG. 2 illustrates an exemplary oscillogram of clock signals associated with the clock circuit 100. Part (A) of FIG. 2 illustrates an oscillogram of the initial clock signal CLK1 that is provided to the clock drive circuit 110, which is a square wave of four states P1-P4. Part (B) of FIG. 2 illustrates an oscillogram of a clock signal CLK2 that is output by the clock drive circuit 110 and is provided to the clock drive circuit 120, which is a square wave of four states P1'-P4' corresponding to states P1-P4. Part (C) of FIG. 2 illustrates an oscillogram of a clock signal CLK3 that is output by the clock drive circuit 120 and is provided to the clock drive circuit 130, which is a square wave of four states P1"-P4" corresponding to states P1'-P4'. Herein, the "correspondence" between two states of two clock signals may mean that one state of one clock signal is generated in response to the other state of the other clock signal. For example, the state P1' of the clock signal CLK2 is generated by the clock drive circuit 110, in response to the clock signal CLK1 in the state P1 being input to the clock drive circuit 110.

In the example of part (A) of FIG. 2, the clock signal CLK1 is a square wave with a duty cycle of 50%. The square wave includes two clock cycles, wherein a first clock cycle includes a high-level state P1 and a low-level state P2, and the second clock cycle includes a high-level state P3 and a low-level state P4. The duty cycle herein may be described as a ratio that a duration of a high-level state accounts for a total duration of a single clock cycle. In the square wave with a duty cycle of 50%, the states P1, P2, P3 and P4 have a same duration, which we assume is 0.5 unit time.

According to FIG. 1, the clock signal CLK1 is provided to the clock drive circuit 110. The clock signal CLK2 is obtained through the clock drive circuit 110. A duty cycle of the clock signal CLK2 is different from that of the clock signal CLK1. This difference may be caused by many factors. For example, each inverter 111, 112 in the clock drive circuit 110 is not absolutely ideal, and a rise time (time for converting to the high-level from the low-level) and a fall time (time for converting to the low-level from the high-level) of the output signal of each inverter will not strictly be the same. Consequently, the duration of the high-level state (or the low-level state) of the input signal of the inverter will change after passing through the inverter. In addition, an output capacitance load of the first inverter 111 of the clock drive circuit 110 is associated with the inverter 112, while the output capacitance load of the last inverter 112 of the clock drive circuit 110 is associated with the first inverter 121 of the next stage of the clock drive circuit 120 as well as the corresponding stage of pipeline circuit 310. Such unbalanced loads will also cause the duration of the high-level state (or the low-level state) of the output signal of the inverter 111 to change after passing through the inverter 112. As a result of comprehensive impact by the clock drive circuit 110, the high-level state of the clock signal CLK1 will be prolonged (or shortened) after passing through the clock drive circuit 110. Accordingly, the duty cycle of the resulting clock signal, CLK2, is different from that of the clock signal CLK1.

For the purpose of discussion, it is assumed herein that the high-level states P1, P3 of the clock signal CLK1 are prolonged after passing through the clock drive circuit 110, and the low-level states P2, P4 are shortened after passing through the clock drive circuit 110. As shown in part (B) of FIG. 2, the duration of each of the states P1', P3' (corresponding to the high-level states P1, P3) has been prolonged to 0.51 unit time, and the duration of each of the states P2', P4' (corresponding to the low-level states P2, P4) has been shortened to 0.49 unit time.

Since the clock drive circuit 110 includes an even number of inverters, the states P1'-P4' of the clock signal CLK2 are in-phase to the states P1-P4 of the clock signal CLK1; that is, the states P1', P3' corresponding to the high-level states P1, P3 are still high-level states, and the states P2', P4' corresponding to the low-level states P2, P4 are still low-level states. The duty cycle of the clock signal CLK2 is calculated to be 51%, which is greater than the duty cycle (50%) of the initial clock signal CLK1.

According to FIG. 1, the clock signal CLK2 output by the clock drive circuit 110 is then provided to the clock drive circuit 120. The clock signal CLK3 is obtained through the clock drive circuit 120. The clock drive circuit 120 has the same structure as the clock drive circuit 110, so the impact of the clock drive circuit 120 on the clock signal CLK2 is the same as that of the clock drive circuit 110 on the clock signal CLK1; that is, the state corresponding to the high-level state in the input signal is prolonged, and the state corresponding to the low-level state in the input signal is shortened. As shown in part (C) of FIG. 2, the duration of each of the states P1", P3" of the clock signal CLK3 (corresponding to the high-level states P1', P3') has been prolonged to 0.52 unit time, while the duration of each of the states P2", P4" (corresponding to the low-level states P2', P4') has been shortened to 0.48 unit time.

Similarly, due to the clock drive circuit 120 including an even number of inverters, the states P1"-P4" of the clock signal CLK3 are in-phase with the states P1'-P4' of the clock signal CLK2; that is, the states P1", P3" corresponding to the high-level states P1', P3' are still high-level states, and the states P2", P4' corresponding to the low-level states P2' P4' are still low-level states. The duty cycle of the clock signal CLK3 is calculated to increase to 52%, which is greater than the duty cycle (51%) of the clock signal CLK2, further deviated from the initial clock signal CLK1 in a direction of increasing the duty cycle.

The clock signal CLK3 output by the clock drive circuit 120 is provided to the clock drive circuit 130. Based on a similar analysis, the duty cycle of the clock signal (not shown) output by the clock drive circuit 130 will be greater than that of the clock signal CLK3, further deviated from the initial clock signal CLK1 in a direction of increasing the duty cycle.

Although FIG. 2 illustrates an example where the high-level state of the clock signal is prolonged after passing through each stage of clock drive circuit, the high-level state of the clock signal might be shortened after passing through each stage of clock drive circuit in other examples. In these other examples, the clock signal output by each stage of clock drive circuit will be gradually deviated from the initial clock signal in a direction of reducing (instead of increasing) the duty cycle.

It can be learned from the above analysis that, for the clock circuit 100, the duty cycle of the clock signal output by the clock drive circuit will be deviated farther from the duty cycle of the initial clock signal as the stage of clock drive circuit increases. That is, the deviation of the duty cycle will be accumulated with the increased stage of clock drive circuit. Even though the deviation of the duty cycle of one stage of the clock drive circuit is tiny as compared with the duty cycle of the previous stage of drive circuit, the accumulated deviation is also remarkable after dozens or hundreds of stages of clock drive circuits. Due to the accumulated deviation, the duty cycle of the clock signal output by a far downstream clock drive circuit in the clock circuit will be significantly different from that of the clock signal output by a far upstream clock drive circuit.

In order to maintain a stable duty cycle, one conventional method is to incorporate a duty cycle detection circuit and an adjusting circuit into each stage of clock drive circuit. The duty cycle detection circuit may be configured to detect a duty cycle of the clock signal, and to activate the adjusting circuit when a certain offset has occurred to the duty cycle. The duty cycle adjusting circuit may adjust the clock signal to reduce the offset of the duty cycle. However, the duty cycle detection circuit and the adjusting circuit are usually complex with high design and manufacturing costs, and has a large footprint.

The applicant of the present disclosure realizes that an odd number of inverters arranged in each stage of clock drive circuit may advantageously maintain the duty cycle of the clock signal without significantly increasing the complexity of the clock circuit. A clock circuit according to embodiments of the present disclosure may include M stages of clock drive circuits that are connected in series, where M may be an integer not less than 2. N inverters connected in series may be arranged between an input port and an output port of each stage of the M stages of clock drive circuits of the clock circuit, wherein N is an odd number not less than 3.

Figure 3:
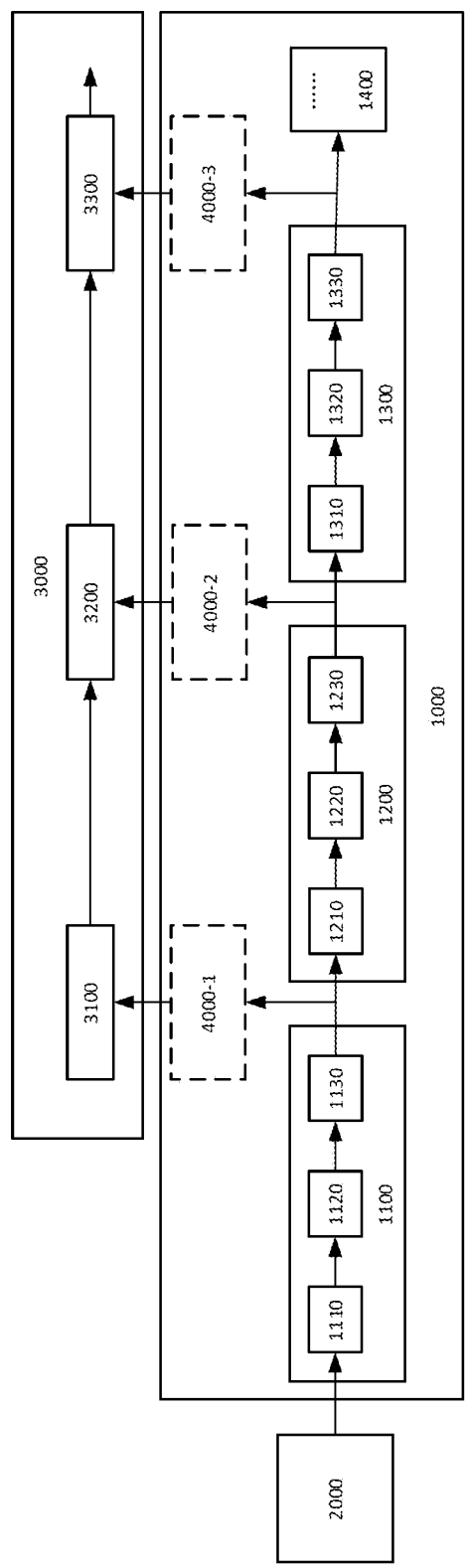
FIG. 3 illustrates a schematic diagram of a clock circuit according to embodiments of the present disclosure.

FIG. 3 illustrates a schematic diagram of a clock circuit 1000 according to embodiments of the present disclosure. To simplify the description, the clock circuit 1000 shown in FIG. 1 includes three clock drive circuits 1100, 1200 and 1300. The three clock drive circuits 1100, 1200 and 1300 are connected in series. The clock circuit 1000 may be coupled to a clock source 2000 and configured to receive an initial clock signal from the clock source 2000. The initial clock signal provided by the clock source 2000 may be provided to a first stage of clock drive circuit 1100. An output clock signal of the first stage of clock drive circuit 1100 may be provided to a second stage of clock drive circuit 1200. An output clock signal of the second stage of clock drive circuit 1200 may be provided to a third stage of clock drive circuit 1300.

One should note that, although FIG. 3 illustrates three clock drive circuits in serial connection, the clock circuit 1000 may include more or fewer clock drive circuits, for example, 2, 10, 50 clock drive circuits or more than 100 clock drive circuits. In FIG. 3, the box with an ellipsis shows an additional module 1400 for receiving the clock signal that is output from the clock drive circuit 1300, and the additional module 1400 may represent a plurality of clock dive circuits that are not specifically shown or represent a tail port load component.

Each clock drive circuit in the clock drive circuits 1100, 1200 and 1300 of the clock circuit 1000 includes three (N=3) inverters that are connected in series. Specifically, the clock drive circuit 1100 includes inverters 1110, 1120, 1130 connected in series, the clock drive circuit 1200 includes inverters 1210, 1220, 1230 connected in series, and the clock drive circuit 1300 includes inverters 1310, 1320, 1330 connected in series. If the additional module 1400 represents a plurality of clock drive circuits not specifically shown, each of the plurality of clock drive circuits will also include three inverters that are connected in series.

It is appreciated that, although FIG. 3 illustrates that each stage of clock drive circuit may include three inverters in serial connection, each stage of clock drive circuit in other embodiments may include more inverters in serial connection as long as the number of inverters is an odd number and each stage of clock drive circuit has a same number of inverters. For example, each stage of clock drive circuit may include 5, 7, 9 or more inverters in serial connection. Using more inverters may be beneficial. Because the inverters are active devices, more inverters can ensure that the clock signals can still maintain a certain signal amplitude even after being transmitted through dozens of stages of clock drive circuits. However, more inverters may increase power consumption and occupied footprint. It may be compromised between the number of the inverters and the power consumption and the occupied footprint. Preferably, each stage of clock drive circuit includes three inverters in serial connection.

The applicant of the present disclosure realizes that an odd number inverters arranged in each stage of clock drive circuit may advantageously maintain the duty cycle of the clock signal. This will be discussed below with reference to FIG. 4.

Figure 4:
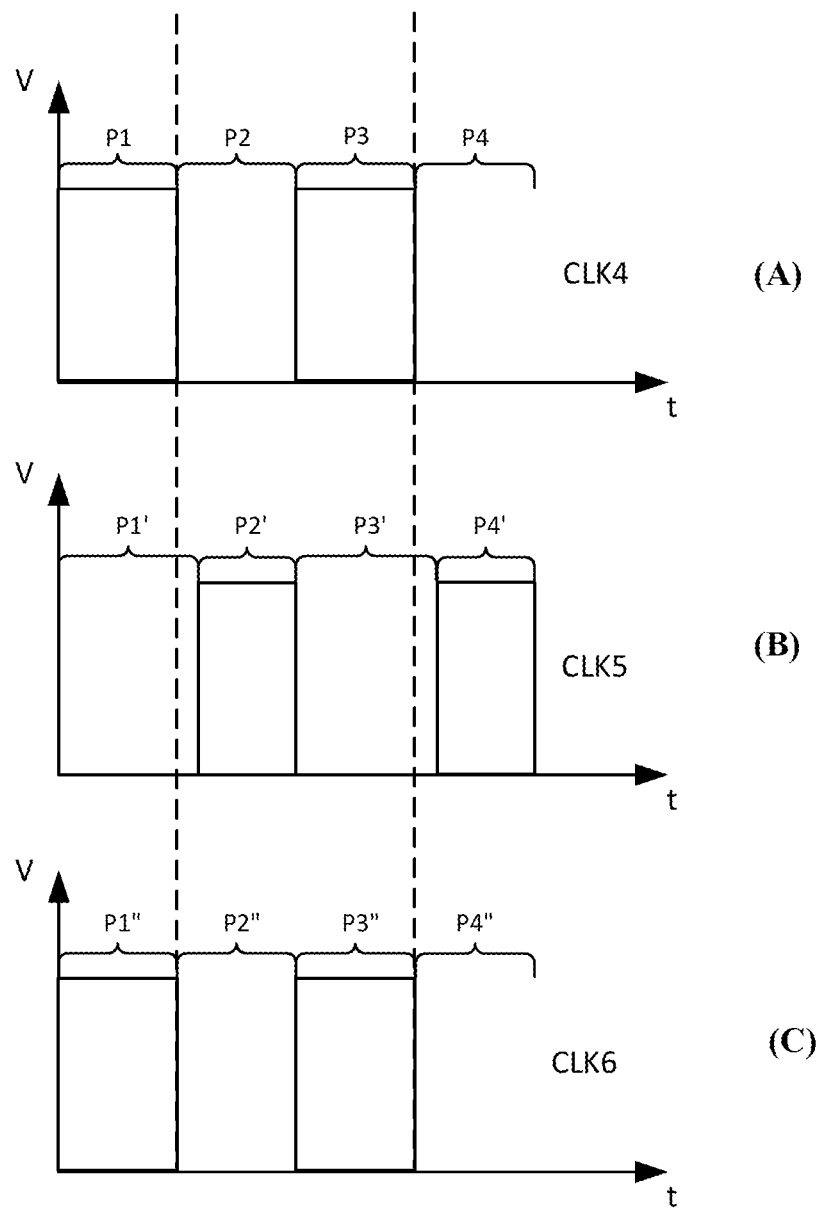
FIG. 4 illustrates an exemplary oscillogram of clock signals associated with the clock circuit of FIG. 3.

FIG. 4 illustrates an exemplary oscillogram of clock signals associated with the clock circuit 1000. Part (A) of FIG. 4 illustrates an oscillogram of a clock signal CLK4 provided to the clock drive circuit 1100, which includes a square wave of four states P1-P4. Part (B) of FIG. 4 illustrates an oscillogram of a clock signal CLK5 that is output by the clock drive circuit 1100 and provided to the clock drive circuit 1200, which includes a square wave of four states P1'-P4' corresponding to the states P1-P4. Part (C) of FIG. 4 illustrates an oscillogram of a clock signal CLK6 that is output by the clock drive circuit 1200 and provided to the clock drive circuit 1300, which includes a square wave of four states P1"-P4" corresponding to the states P1'-P4'.

In part (A) of FIG. 4, the clock signal CLK4 is a square wave with a duty cycle of 50%. The square wave includes two clock cycles, wherein the first clock cycle includes a high-level state P1 and a low-level state P2, and the second clock cycle includes a high-level state P3 and a low-level state P4. In the square wave with the duty cycle of 50%, the states P1, P2, P3 and P4 have the same duration, which we assume is 0.5 unit time. The clock signal CLK4 may be similar to the clock signal CLK1 described in part (A) of FIG. 2.

According to FIG. 3, the clock signal CLK4 is provided to the clock drive circuit 1100. The clock signal CLK5 is obtained through the clock drive circuit 1100. As described above, due to many non-ideal factors, the high-level state of the clock signal CLK4 will be prolonged or shortened after passing through the clock drive circuit 1100. Being consistent with the assumption adopted in the discussion for FIG. 2, it is assumed herein that the high-level state of the clock signal CLK4 will be prolonged after passing through the clock drive circuit 1100. As shown in part (B) of FIG. 4, the duration of each of the states P1', P3' of the clock signal CLK5 (corresponding to the high-level states P1, P3) is prolonged to 0.51 unit time, and the duration of the states P2', P4' (corresponding to the low-level states P2, P4) is shortened to 0.49 unit time.

Note that the clock drive circuit 1100 includes an odd number of inverters, so the states P1'-P4' of the clock signal CLK5 are inverted with respect to the states P1-P4 of the clock signal CLK4; that is, the states P1', P3' corresponding to the high-level states P1, P3 are converted to low-level states, and the states P2', P4' corresponding to the low-level states P2, P4 are converted to high-level states. The duty cycle of the clock signal CLK5 is therefore calculated to be 49%, which is reduced as compared to the duty cycle (50%) of the initial clock signal CLK4.

According to FIG. 3, the clock signal CLK5 output by the clock drive circuit 1100 is provided to the clock drive circuit 1200. The clock signal CLK6 is obtained through the clock drive circuit 1200. The clock drive circuit 1200 has a same structure as the clock drive circuit 1100, so the impact of the clock drive circuit 1200 on the clock signal CLK5 is the same as that of the clock drive circuit 1100 on the clock signal CLK4; that is, the state corresponding to any high-level state in the input signal is prolonged, and the state corresponding to any low-level state in the input signal is shortened. Accordingly, as shown in part (C) of FIG. 4, the duration of each of the states P2", P4" of the clock signal CLK6 (corresponding to the high-level states P2', P4') has been prolonged to 0.5 unit time from 0.49 unit time of the states P2', P4'. Moreover, the duration of each of the states P1", P3" (corresponding to the low-level states P1', P3') has been shortened to 0.5 unit time from the 0.51 unit time of the states P1', P3'.

Note that the clock drive circuit 1200 includes an odd number of inverters, so the states P1"-P4" of the clock signal CLK6 are inverted with respect to the states P1'-P4' of the clock signal CLK5; that is, the states P1", P3" corresponding to the low-level state P1', P3' are converted to high-level states, and the states P2", P4" corresponding to the high-level states P2', P4' are converted to low-level states. The duty cycle of the clock signal CLK6 is calculated to be 50%, which is increased relative to the duty cycle (49%) of the clock signal CLK5.

Based on the above analysis, it can be learned that, in the clock circuit 1000 shown in FIG. 3, the duty cycle of the clock signal CLK5 is reduced relative to that of the clock signal CLK4, while the duty cycle of the clock signal CLK6 is increased relative to that of the clock signal CLK5. The duty cycle of the clock signal CLK6 is recovered to that of the clock signal CLK4. This is caused by a combination of facts that (i) impact of each stage of clock drive circuit on the clock signal is identical, and (ii) the input signal and the output signal have opposite phases. As such, deviations of the duty cycle caused by adjacent two stages of clock drive circuits may cancel each other to some extent, instead of accumulating. So the duty cycle of the clock signal output by each stage of clock drive circuit always fluctuates around the duty cycle of the initial clock signal. Therefore, even though the clock circuit 1000 may include dozens or hundreds of stages of clock drive circuits, the duty cycle of the output clock signal of the far downstream clock drive circuit will not significantly deviate from that of the output clock signal output from the far upstream clock drive circuit.

In addition, one should note that the clock circuit 1000 only uses a specific number (namely, an odd number) of inverters instead of using any complex duty cycle detection circuit or duty cycle adjusting circuit. The inverters are simple electronic components, so their complexity and cost are much less than the duty cycle detection circuit and the adjusting circuit. Therefore, the clock circuit 1000 may be able to provide clock signals having a stable duty cycle with a simple structure and low cost.

It is understood that each clock signal shown in FIG. 4 is merely exemplary. In an alternative embodiment, the clock signal may have different attributes or parameters. For example, the duty cycle of the initial clock signal CLK4, which is provided to the clock drive circuit 1100, may not be limited to 50%, and may be less or greater. Moreover, each stage of clock drive circuit may instead shorten the state corresponding to the high-level state in the input signal and prolong the state corresponding to the low-level state in the input signal. In addition, the degree at which each state is shortened or prolonged may not be limited to the specific values described above. The description of FIG. 4 merely aims to clearly illustrate the basic principle of the embodiments of the present disclosure, instead of imposing limitation. It is understood that, even though the clock signal in other embodiments may adopt different attributes or parameters, that clock signal will not violate the basic principles illustrated in FIG. 4.

According to embodiments of the present disclosure, each stage of the M stages of clock drive circuits of the clock circuit 1000 may provide a clock signal to a corresponding stage of pipeline circuit in a pipeline structure, for executing the data processing task.

Returning to FIG. 3, the output port of the clock drive circuit 1100 may be coupled to the corresponding stage of pipeline circuit 3100 in the pipeline structure 3000, the output port of the clock drive circuit 1200 may be coupled to the corresponding stage of pipeline circuit 3200 in the pipeline structure 3000, and the output port of the clock drive circuit 1300 may be coupled to the corresponding stage of pipeline circuit 3300 in the pipeline structure 3000. The pipeline circuits 3100, 3200 and 3300, driven by the corresponding clock signals, may execute various data processing tasks.

According to embodiments of the present disclosure, a corresponding load balancing and phase adjusting module may be optionally arranged between the output port of each stage of the M stages of clock drive circuits of the clock circuit 1000 and the clock signal input port of the corresponding stage of pipeline circuit in the pipeline structure 3000. As shown in FIG. 3, a load balancing and phase adjusting module 4000-1 may be arranged between the clock drive circuit 1100 and the corresponding stage of pipeline circuit 3100. A load balancing and phase adjusting module 4000-2 may be arranged between the clock drive circuit 1200 and the corresponding stage of pipeline circuit 3200, and a load balancing and phase adjusting module 4000-3 may be arranged between the clock drive circuit 1300 and the corresponding stage of pipeline circuit 3300.

It is appreciated that each of the load balancing and phase adjusting modules 4000 is shown as a dashed box in the clock drive circuit 1000 in FIG. 3, which indicates that the load balancing and phase adjusting modules 4000 are optional. In some embodiments, the load balancing and phase adjusting modules 4000 may be located within the clock circuit 1000. In other embodiments, the load balancing and phase adjusting modules 4000 may be located outside the clock circuit 1000.

According to embodiments of the present disclosure, a load balancing and phase adjusting module may form a part of an output capacitance load of a corresponding stage of clock drive circuit. For example, the load balancing and phase adjusting module 4000-1 may form a part of the output capacitance load of the clock drive circuit 1100 (specifically, the inverter 1130). Moreover, the clock drive circuit 1100 is separated from the corresponding stage of pipeline circuit 3100 by the load balancing and phase adjusting module 4000-1, so that the pipeline circuit 3100 has almost no impact on the output capacitance load of the clock drive circuit 1100. The load isolation may be beneficial, because the state of the pipeline structure 3100 will not affect the clock drive circuit 1100. The output capacitance load of the clock drive circuit 1100 is mainly associated with the input capacitance values of the load balancing and phase adjusting module 4000-1 and the next stage of clock drive circuit 1200 (specifically, the inverter 1210). Similarly, the load balancing and phase adjusting module 4000-2 and the load balancing and phase adjusting module 4000-3 may form a part of the output capacitance loads of the corresponding stages of clock drive circuits 1200, 1300 respectively.

It is appreciated that: "an electronic component has an input capacitance of c" herein means that an input port of the electronic component appear to be a load with the capacitance value c towards another electronic component when it is connected to an output port of that other electronic component, while "an electronic component has an output capacitance of c" means that other electronic components connected to an output port of this electronic component collectively appear to be a load with the capacitance value c towards this electronic component.

Since each stage of clock drive circuit uses an odd number of inverters, the clock signals output by adjacent stages of clock drive circuits are opposite in phase (for example, CLK4 vs CLK5, or CLK5 vs CLK6). Some pipeline structures allow use of a plurality of clock signals with inconsistent phases. However, in some specific pipeline structures, it is expected that the clock signals used by various stages of pipelines circuit are in-phase. According to embodiments of the present disclosure, the load balancing and phase adjusting module may be configured to adjust the phase of the clock signal output by the corresponding stage of clock drive circuit, so that the clock signal provided to each stage of pipeline circuit is in-phase. After the phase adjustment, the clock signal may be transmitted to the corresponding stage of clock drive circuit.

In order to provide the in-phase clock signals to various stages of pipeline circuits, the load balancing and phase adjusting modules 4000-1, 4000-2, 4000-3 may be configured. As an example, the load balancing and phase adjusting module 4000-2 may be configured to invert the output clock signal (such as, CLK5) of the clock drive circuit 1200, and this inverted clock signal is provided to the pipeline circuit 3200. The load balancing and phase adjusting modules 4000-1, 4000-3 may not invert corresponding output clock signals. As a result, the clock signals provided to the pipeline circuits 3100, 3200, 3300 will be in-phase. As an alternative example, the load balancing and phase adjusting modules 4000-1, 4000-3 may be configured to invert the output clock signals (such as, CLK4 and CLK6) of the clock drive circuits 1100, 1300 respectively, while the load balancing and phase adjusting module 4000-2 may not invert the corresponding output clock signal. As a result, the clock signals provided to the pipeline circuits 3100, 3200, 3300 will be in-phase. It is appreciated that each of the load balancing and phase adjusting modules 4000 only adjusts the clock signal to be provided to the pipeline circuit, but will not affect the clock signal to be provided to the next stage of clock drive circuit.

Figure 5A:
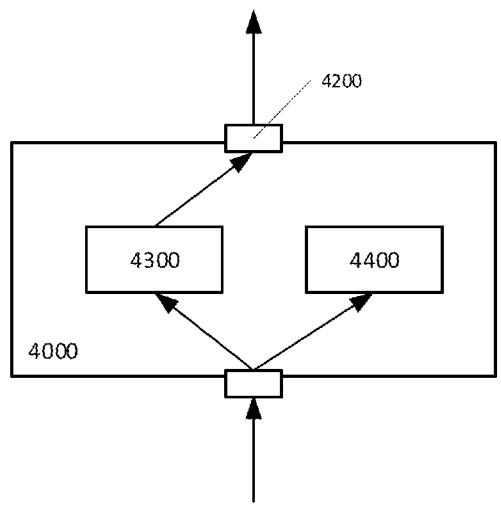
FIGS. 5A-5B illustrates two exemplary configuration modes for a load balancing and phase adjusting module according to embodiments of the present disclosure.
Figure 5B:
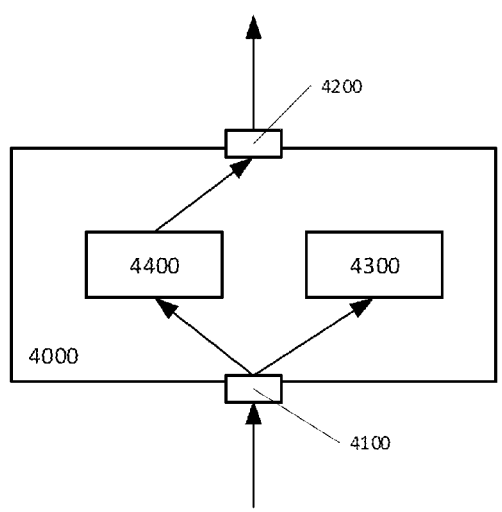

In order to achieve the above functions, the load balancing and phase adjusting modules 4000 may have various configurations. FIGS. 5A-5B illustrate two exemplary configuration modes of a load balancing and phase adjusting module according to embodiments of the present disclosure.

In the first configuration mode as shown in FIG. 5A, the load balancing and phase adjusting module 4000 may have an inverter 4300 and a buffer 4400. An input port of the inverter 4300 and an input port of the buffer 4400 are both connected to the input port 4100 of the load balancing and phase adjusting modules 4000. The input port 4100 may be connected to the output port of the corresponding stage of clock drive circuit, so as to receive the output clock signal. An output port of the inverter 4300 is connected to the output port 4200 of the load balancing and phase adjusting modules 4000, while an output port of the buffer 4400 is unloaded. "Unloaded" means that the output port of the circuit unit is floated and not connected to any other circuit element. The output port 4200 may be connected to the clock signal input port of the corresponding stage of pipeline circuit. In such configuration mode, the input capacitance of the load balancing and phase adjusting modules 4000 depends on the inverter 4300 and the buffer 4400. Moreover, the output signal from the load balancing and phase adjusting module 4000 is inverted with respect to its input signal.

In the second configuration mode as shown in FIG. 5B, the load balancing and phase adjusting module 4000 may have an inverter 4300 and a buffer 4400. An input port of the inverter 4300 and an input port of the buffer 4400 are both connected to the input port 4100 of the load balancing and phase adjusting modules 4000. The input port 4100 may be connected to the output port of the corresponding stage of clock drive circuit, so as to receive the output clock signal. An output port of the buffer 4400 is connected to the output port 4200 of the load balancing and phase adjusting modules 4000, while an output port of the inverter 4300 is unloaded. The output port 4200 may be connected to the clock signal input port of the corresponding stage of pipeline circuit. In such configuration mode, the input capacitance of the load balancing and phase adjusting module 4000 also depends on the inverter 4300 and the buffer 4400. However, the input signal is not inverted by the buffer, so the output signal of the load balancing and phase adjusting module 4000 is in-phase to its input signal.

In the two configuration modes as shown in FIGS. 5A-5B, the load balancing and phase adjusting modules 4000 may use inverters and buffers. The inverters and the buffers are both simple and basic circuit components, which have the advantages of low cost and easy use. Moreover, the load balancing and phase adjusting modules 4000 have a very simple circuit structure, which will not significantly increase circuit cost and complexity.

According to embodiments of the present disclosure, two load balancing and phase adjusting modules corresponding to adjacent two stages of clock drive circuits in the M-stage clock drive circuit of the clock circuit 1000 may have different configuration modes, which are selected from the first configuration mode and the second configuration mode respectively. As an example, the load balancing and phase adjusting module 4000-2 corresponding to the clock drive circuit 1200 may have the first configuration mode, while the load balancing and phase adjusting modules 4000-1, 4000-3 corresponding to the clock drive circuits 1100, 1300 respectively may have the second configuration mode. As an alternative example, the load balancing and phase adjusting module 4000-2 may have the second configuration mode, while the load balancing and phase adjusting modules 4000-1, 4000-3 may have the first configuration mode. As such, it is ensured that the clock signals provided to the pipeline circuits 3100, 3200 and 3300 are in-phase with each other.

In addition, in order to cancel the impact of the adjacent two stages of clock drive circuits on the duty cycle of the clock signal as much as possible, the electrical structure of each stage of clock drive circuit of the clock circuit 1000 may be the same as much as possible. Correspondingly, the electronic components associated with the clock circuit 1000 may be selected in a specific way.

According to embodiments of the present disclosure, the $k^{th}$ inverter in N inverters of each stage in the M stages of clock drive circuits of the clock circuit may have a same input capacitance, with $1 \leq K \leq N$. Specifically, the first inverters 1110, 1210, 1310 in each stage of clock drive circuit in FIG. 3 may have the same input capacitance $c_1$, the second inverters 1120, 1220, 1320 may have the same input capacitance $c_2$, and the third inverters 1130, 1230, 1330 may have the same input capacitance c3. In this configuration, each stage of clock drive circuit may have the same electrical structure, thereby having the same input capacitance. Preferably, the inverters 1110, 1120, 1130, 1210, 1220, 1230, 1310, 1320 and 1330 may be selected as identical inverters, for example, inverter devices of the same model, which further reduces complexity of the clock circuit.

According to embodiments of the present disclosure, the load balancing and phase adjusting module corresponding to each stage of the M stages of clock drive circuits of the clock circuit may have a same input capacitance. Specifically, the load balancing and phase adjusting modules 4000-1, 4000-2 and 4000-3 may have the same input capacitance. Preferably, the inverters in the load balancing and phase adjusting modules 4000 may have the same input capacitance, and the buffers in the load balancing and phase adjusting modules 4000 may have the same input capacitance. Specifically, no matter which configuration in FIGS. 5A-5B is adopted, the inverter 4300 of the load balancing and phase adjusting module may have a specified input capacitance c4, and the buffer 4400 may have a specified input capacitance c5. The inverter 4300 may be the same as or may be different from each of the inverters 1110, 1120, 1130, 1210, 1220, 1230, 1310, 1320 and 1330.

Additionally, considering that the last stage of clock drive circuit in the M-stage clock drive circuit is not connected to any next stage of clock drive circuit, it is necessary to perform a special configuration on the output capacitance load of the last stage of clock drive circuit, so that the last stage of clock drive circuit has the same output capacitance load as other clock drive circuits. For this purpose, the output port of the $M^{th}$ stage of clock drive circuit may be connected to an additional load element, which has the same input capacitance as the first inverter in N inverters in each stage of clock drive circuit. For example, assuming that the clock circuit 1000 shown in FIG. 3 only includes three clock drive circuits (M=3), the additional module 1400 may have the same input capacitance c1 as the inverters 1110, 1210, 1310. This ensures that the clock drive circuit 1300 has the same output capacitance load as the clock drive circuits 1100, 1200.

According to some embodiments of the present disclosure, the clock source 2000 that provides the initial clock signal to the clock circuit 1000 may be located outside the clock circuit 1000. The input port of the first stage of clock drive circuit in the M-stage drive circuits of the clock circuit 1000 may be connected to the clock source to receive the initial clock signal. According to other embodiments of the present disclosure, the clock source 2000 may be used as a part of the clock circuit 1000 and be located within the clock circuit 1000. The clock source 2000 may be any component capable of providing a clock signal, including an oscillator generating a raw clock waveform, or another clock circuit that is driven by a clock waveform to output a clock signal.

According to embodiments of the present disclosure, the initial clock signal provided to the clock circuit 1000 by the clock source 2000 may be a square clock signal with a specific duty cycle. The duty cycle of the clock signals output by various stages of clock drive circuit of the clock circuit 1000 will be maintained closely to that specific duty cycle. That is, each stage of clock drive circuit of the clock circuit 1000 may maintain the duty cycle of the output clock signal around the duty cycle of the initial clock signal. Preferably, the specific duty cycle is 50%.

According to embodiments of the present disclosure, the clock circuit 1000 may be used in combination with the pipeline structure 3000. Driven by individual clock signals provided by the clock circuit 1000, individual stages of pipeline circuits of the pipeline structure 3000 may execute various data processing tasks. The data processing tasks herein include but are not limited to data storage, data operation, etc.

According to embodiments of the present disclosure, the data processing tasks executed by the pipeline structure 3000 include execution of hash algorithm(s). Specifically, the hash algorithm(s) may be SHA-256 algorithm(s).

The hash algorithm is an algorithm that takes length-variable data as input and generates a hash value of a fixed length as output. In the hash algorithm, input data with a random length will be filled, so that the length of the filled data is integral multiple of a certain fixed length (such as 512 bits); that is, the filled data may be divided into a plurality of data blocks of the fixed length. The content of the filled bits includes bit length information of the original data. Then the hash algorithm will perform operation processing on each data block of the fixed length respectively, including, for example, multi-rounds of data expansion and/or compression, etc. When all data blocks have been used, a final hash value of the fixed length is obtained.

Since 1993, the National Institute of Standards and Technology of the United States has successively designed and released many versions of the Secure Hash Algorithm (SHA), of which SHA-256 is a secure hash algorithm with a hash length of 256 bits. The SHA-256 algorithm is one of the widely used hash algorithms related to virtual encrypted digital currency (such as Bitcoin). For example, Bitcoin is a Proof of Work (POW) that is based on the SHA-256 algorithm. The key for mining Bitcoins with a data processing device (such as a mining machine) is to obtain Bitcoin rewards according to ability of the data processing device for SHA-256 calculation.

For hash algorithms (such as the SHA-256 algorithm) containing multi-rounds of operations, a pipeline structure with a plurality of operation stages may be used to achieve high-speed operations. For example, when executing the SHA-256 algorithm, repeating 64 rounds of operations is required for each 512-bit data block, therefore a 64-stage pipeline structure may be adopted to operate on 64 sets of data in parallel.

Figure 6:
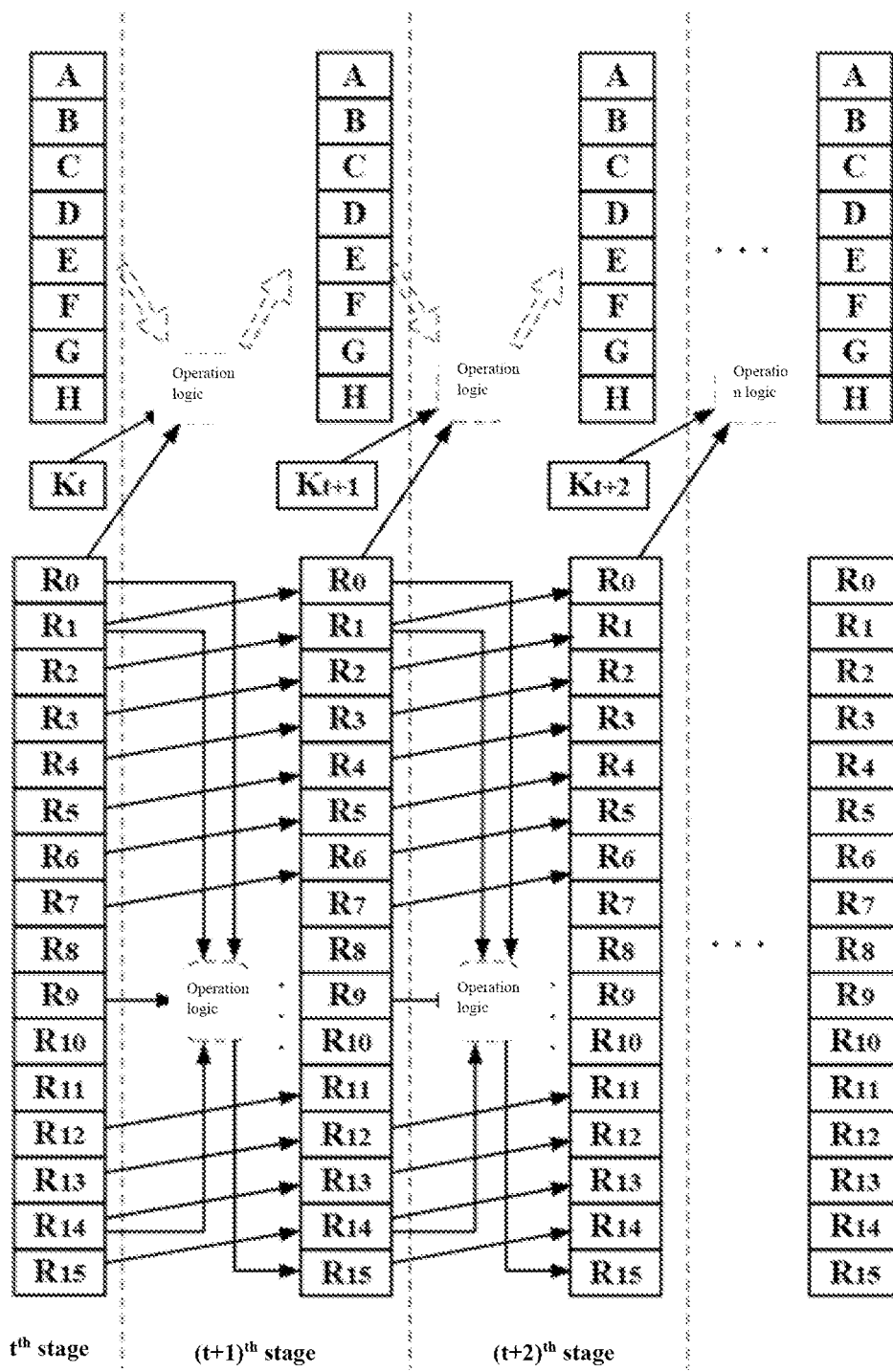
FIG. 6 illustrates a schematic diagram of a pipeline structure capable of implementing SHA-256 algorithm(s).

FIG. 6 illustrates a schematic diagram of a pipeline structure 6000 capable of implementing the SHA-256 algorithm. The pipeline structure 6000 may be a specific use case of the pipeline structure 3000 described above. As shown in FIG. 6, the $t^{th}$ operation stage, the $(t+1)^{th}$ operation stage and the $(t+2)^{th}$ operation stage in the pipeline structure 6000 are divided by dotted lines. Each operation stage may include a plurality of registers A-H for storing intermediate values and a plurality of registers R0-R15 for storing extended data respectively. In addition, each operation stage may also include operation logic. Each operation stage may be implemented by a corresponding stage of pipeline circuit. The pipeline circuit may include storage circuits for implement individual registers and operation circuits for implementing the operation logic, etc. During execution of the SHA-256 algorithm, registers in each pipeline circuit in the pipeline structure 6000 update the data stored therein based on corresponding clock signals. Since the pipeline structure 6000 includes a plurality of stages, the pipeline structure 6000 has a strict requirement on the duty cycle of each clock signal. The clock circuit 1000 described above may provide the clock signals to the pipeline structure 6000. Each clock signal provided by the clock circuit 1000 has a stable duty cycle, so the clock circuit 1000 is specifically suitable for implementing the pipeline structure 6000 for the SHA-256 algorithm.

According to embodiments of the present disclosure, the clock circuit may be included in various devices, which include but are not limited to a computing chip, a hash board and a data processing device (such as a digital currency mining machine), etc. Since the clock circuit according to embodiments of the present disclosure is adopted, these devices can obtain individual clock signals with stable duty cycles at a low cost and a simple circuit structure, thereby guaranteeing performance of the devices when executing the specific computing tasks.

Figure 7:
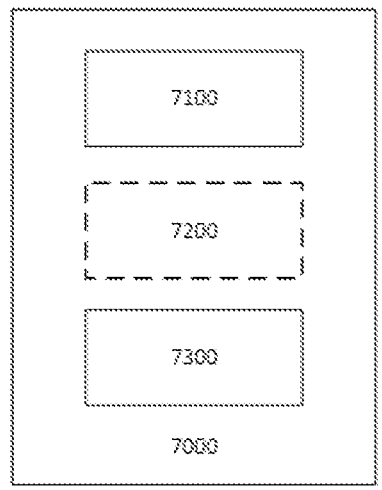
FIG. 7 illustrates a schematic block diagram of a computing chip according to embodiments of the present disclosure.

FIG. 7 illustrates a schematic block diagram of a computing chip 7000 according to embodiments of the present disclosure. The computing chip 7000 may include a clock circuit 7100, a clock source 7200 and a pipeline structure 7300. The clock circuit 7100 may be a specific embodiment of the clock circuit 1000 described above. The clock source 7200 may be a specific example of the clock source 2000 described above. The pipeline structure 7300 may be a specific example of the pipeline structure 3000 or 6000 described above. The clock circuit 7100 may be coupled to the clock source 7200 and to the pipeline structure 7300. The clock circuit 7100 may receive an initial clock signal from the clock source 7200 and correspondingly generate a plurality of clock signals. The plurality of clock signals may be provided to the pipeline structure 7300 for execution specific computing tasks. The specific computing tasks may comprise, for example, executing the SHA-256 algorithm. Correspondingly, the computing chip 7000 may be configured as a Bitcoin chip. In FIG. 7, the clock source 7200 is shown by a dashed box, indicating that the clock source 7200 may also be located outside the computing chip 7000.

Figure 8:
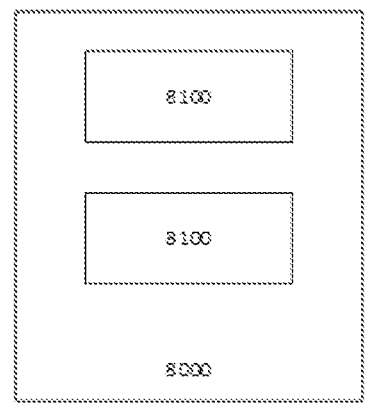
FIG. 8 illustrates a schematic diagram of a hash board according to embodiments of the present disclosure.

FIG. 8 illustrates a schematic diagram of a hash board 8000 according to embodiments of the present disclosure. The hash board 8000 may include one or more computing chips 8100. The computing chip 8100 may be a specific embodiment of the computing chip 7000. Multiple computing chips 8100 may execute computing tasks in parallel.

Figure 9:
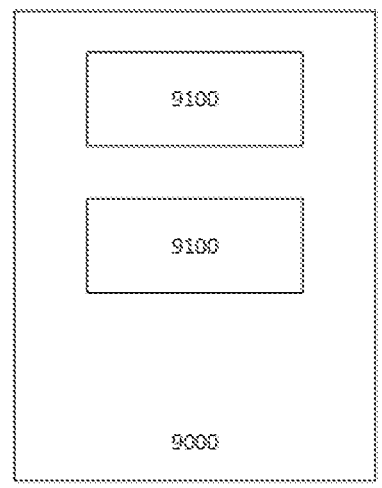
FIG. 9 illustrates a schematic block diagram of a digital currency mining machine according to embodiments of the present disclosure.

FIG. 9 illustrates a schematic block diagram of a digital currency mining machine 9000 according to embodiments of the present disclosure. The digital currency mining machine 9000 is an example of the data processing devices according to embodiments of the present disclosure. The digital currency mining machine 9000 may be configured to execute the SHA-256 algorithm so as to obtain POW (proof of work), and further obtain digital currency based on the POW. The digital currency may be Bitcoin. The digital currency mining machine 9000 may include one or more hash boards 9100. Each of the hash boards 9100 may be a specific embodiment of the hash board 8000. Multiple hash boards 9100 may execute computing tasks in parallel, such as executing the SHA-256 algorithm.

In all examples shown and discussed herein, any specific value should be interpreted as exemplary only, but not a limitation. Therefore, other examples of exemplary embodiments may have different values.

Terms such as "front", 'rear', "top", bottom", "above", "below" and the like in the specification and claims, if used, are used for descriptive purpose and not necessarily used for describing any unchanged relative positions. It is understood that terms used like this may be interchangeable in a suitable case, so that the embodiments of the present disclosure described herein, for example, can be operated in other orientations different from the orientations shown herein or described otherwise.

As used herein, the term "exemplary" means "used as a typical example, an example or illustration", instead of a "model" to be accurately followed. Any implementation exemplarily described herein is not necessarily interpreted as being more optimized or advantageous than other implementations. Moreover, the present disclosure is not restricted by any expressed or implied principle presented in the technical field, the background, the summary or the detailed description above.

As used herein, the term "substantially" means any tiny change caused by design or manufacturing defects, device or component tolerance, environmental impact and/or other factors are within the scope of the disclosure. The term "substantially" also accounts for any difference that is caused by parasitic effect, noise or other actual considerable factors existing in an actual implementation as compared to a perfect or ideal situation.

The above description may indicate components or nodes or features "connected" or "coupled" together. As used herein, unless explicitly stated otherwise, "connected" means a direct connection (or direct communication) of one component/node/feature with another component/node/feature in electrical, mechanical, logical ways or other ways. Similarly, unless explicitly stated otherwise, "coupled" means one component/node/feature is connected with another component/node/feature electrically, mechanically or logically in a direct way or an indirect way or in other ways so as to allow interaction, even if the two features may not be directly connected. That is, "coupled" intends to include direct connection or indirect connection of components or other features, including connections via one or more intermediate components.

It is understood that "comprise/include" used herein means presence of a feature, entirety, a step, an operation, a unit and/or a component, but not excluding presence or addition of one or more other features, entirety, steps, operations, units, and/or components and/or their combination.

Those skilled in the art should understand that a boundary among the above operations is merely illustrative. A plurality of operations may be combined into a single operation, a single operation may be distributed in additional operations, and at least some of the operations may be executed in an overlapped manner in time. Moreover, alternative embodiments may include a plurality of examples with specific operations, and a sequence of operations may be changed in other various embodiments. However, other modifications, changes and replacements may be possible. Therefore, the specification and the drawings should be regarded as illustrative, not restrictive.

Although some specific embodiments of the present disclosure have been described in detail by the example, those skilled in the art should understand that the above examples are merely for illustration, instead of limiting the present disclosure. Various embodiments of the present disclosure may be combined freely, without deviating from the spirit and scope of the present disclosure. Those skilled in the art should also understand that modifications can be made to the embodiments without deviating from the spirit and scope of the present disclosure. The scope of the present disclosure is limited only by the attached claims.

What is claimed is:

1. A clock circuit, comprising M stages of clock drive circuits that are connected in series, M being an integer that is no less than 2, wherein each of the M stages includes N inverters directly connected in series without any intervening element, the N inverters being arranged between an input port and an output port of each stage of the M stages of the clock drive circuits, N being an odd number that is no less than 3, wherein the output port of each stage of the M stages of clock drive circuits provides a clock signal for a corresponding stage of pipeline circuit in a pipeline structure for executing a data processing task.

2. The clock circuit according to claim 1, wherein a corresponding load balancing and phase adjusting module is provided between the output port of each stage of the M stages of clock drive circuits and a clock signal input port of the corresponding stage of pipeline circuit in the pipeline structure, and the load balancing and phase adjusting module contributes to a part of an output capacitance load for said each stage of clock drive circuit and adjusts a phase of the clock signal output by said each stage of clock drive circuit.

3. The clock circuit according to claim 2, wherein the load balancing and phase adjusting module comprises a module inverter and a buffer, and the load balancing and phase adjusting module is configured according to one of following two configuration modes:
  a first configuration mode, in which an input port of the module inverter and an input port of the buffer are both connected to an output port of a corresponding stage of clock drive circuit, an output port of the module inverter is connected to the clock signal input port of the corresponding stage of pipeline circuit in the pipeline structure, and an output port of the buffer is unloaded; or
  a second configuration mode, in which the input port of the module inverter and the input port of the buffer are both connected to the output port of the corresponding stage of clock drive circuit, the output port of the buffer is connected to the clock signal input port of the corresponding stage of pipeline circuit in the pipeline structure, and the output port of the module inverter is unloaded.

4. The clock circuit according to claim 3, wherein two load balancing and phase adjusting modules corresponding to two adjacent stages of the M stages of clock drive circuits have configuration modes that are selected from the first configuration mode and the second configuration mode but are different from each other.

5. The clock circuit according to claim 3, wherein each load balancing and phase adjusting module corresponding to each stage of the M stages of clock drive circuits has a same input capacitance.

6. The clock circuit according to claim 5, wherein the module inverter in all load balancing and phase adjusting modules has a same input capacitance, and the buffer in all load balancing and phase adjusting modules has a same input capacitance.

7. The clock circuit according to claim 1, wherein the $k^{th}$ inverter in the N inverters of each stage of the M stages of clock drive circuits has a same input capacitance as the $k^{th}$ inverter in the N inverters of remaining stages of the M stages of clock drive circuits, $1 \leq k \leq N$.

8. The clock circuit according to claim 7, wherein the N inverters in each stage of the M stages of clock drive circuits are of a same type.

9. The clock circuit according to claim 7, wherein an output port of the $M^{th}$ stage of clock drive circuits is connected to an additional load element, the additional load element having a same input capacitance as the first inverter in the N inverters of each stage of the clock drive circuits.

10. The clock circuit according to claim 1, wherein the input port of the first stage of the M stages of clock drive circuits is connected to an external clock source to receive an initial clock signal.

11. The clock circuit according to claim 10, wherein the initial clock signal is a square wave signal with a duty cycle of 50%.

12. The clock circuit according to claim 1, wherein the data processing task comprises executing a SHA-256 algorithm.

13. The clock circuit according to claim 12, wherein the pipeline circuit comprises at least one of a storage circuit and an operation circuit, for executing the SHA-256 algorithm.

14. A computing chip, comprising the clock circuit according to claim 1.

15. A computing board, comprising the computing chip according to claim 14.

16. A clock circuit, comprising M stages of clock drive circuits that are connected in series, M being an integer that is no less than 2, wherein each of the M stages includes N inverters directly connected in series without any intervening element, the N inverters being arranged between an input port and an output port of each stage of the M stages of the clock drive circuits, N being an odd number that is no less than 3, wherein the $k^{th}$ inverter in the N inverters of each stage of the M stages of clock drive circuits has a same input capacitance as the $k^{th}$ inverter in the N inverters of remaining stages of the M stages of clock drive circuits, $1 \leq k \leq N$.

17. The clock circuit according to claim 16, wherein the N inverters in each stage of the M stages of clock drive circuits are of a same type.

18. The clock circuit according to claim 16, wherein an output port of the $M^{th}$ stage of clock drive circuits is connected to an additional load element, the additional load element having a same input capacitance as the first inverter in the N inverters of each stage of the clock drive circuits.

* * * * *